United States Patent
Liu et al.

(10) Patent No.: US 6,730,604 B1
(45) Date of Patent: May 4, 2004

(54) DYNAMIC CONTAMINATION CONTROL OF EQUIPMENT CONTROLLED BY A SPLIT RUNCARD

(75) Inventors: Chih Pang Liu, Hsinchu (TW); Hao Ming Gong, Hsinchu (TW); Hsien Jung Hsu, Hsinchu (TW); I-Chun Chen, Hsinchu (TW); Tse An Chou, Hsinchu (TW); Larry Jann, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/407,328

(22) Filed: Apr. 4, 2003

Related U.S. Application Data

(60) Provisional application No. 60/432,480, filed on Dec. 11, 2002.

(51) Int. Cl.$^7$ .............................................. H01L 21/311
(52) U.S. Cl. ...................... 438/694; 438/709; 29/25.01; 118/725
(58) Field of Search ........................ 29/25.01; 414/935; 118/725; 438/694, 709

(56) References Cited

U.S. PATENT DOCUMENTS

| | | | | |
|---|---|---|---|---|
| 4,910,043 A | * | 3/1990 | Freeman et al. | 427/563 |
| 4,911,103 A | * | 3/1990 | Davis et al. | 118/725 |
| 4,949,671 A | * | 8/1990 | Davis et al. | 118/725 |
| 5,138,973 A | * | 8/1992 | Davis et al. | 118/723 MP |
| 6,068,668 A | * | 5/2000 | Mastroianni | 29/25.01 |
| 6,428,673 B1 | * | 8/2002 | Ritzdorf et al. | 205/84 |

* cited by examiner

Primary Examiner—John Niebling
Assistant Examiner—Andre' C. Stevenson
(74) Attorney, Agent, or Firm—Slater & Matsil, L.L.P.

(57) ABSTRACT

A method for dynamically maintaining compatible contamination levels of equipment, wafer Lots and FOUP's used for automated processing of a Split Lot of wafers. Processing of the test Lot and the production Lot continue as a single Lot along the production processing path up to a split condition process. Processing of the production Lot is put on hold and its designated contamination level is saved until the alternate processing or test Lot processing is completed. The contamination level of the Split Lot is reevaluated based on the completed process(es) and will be designated at the same level it carried at the Split or a higher contamination level if appropriate. The two Lots are then merged and given the highest contamination level of either the saved level or the Split Lot. The two Lots are then processed according to the original predefined process steps and at the redefined contamination level.

16 Claims, 5 Drawing Sheets

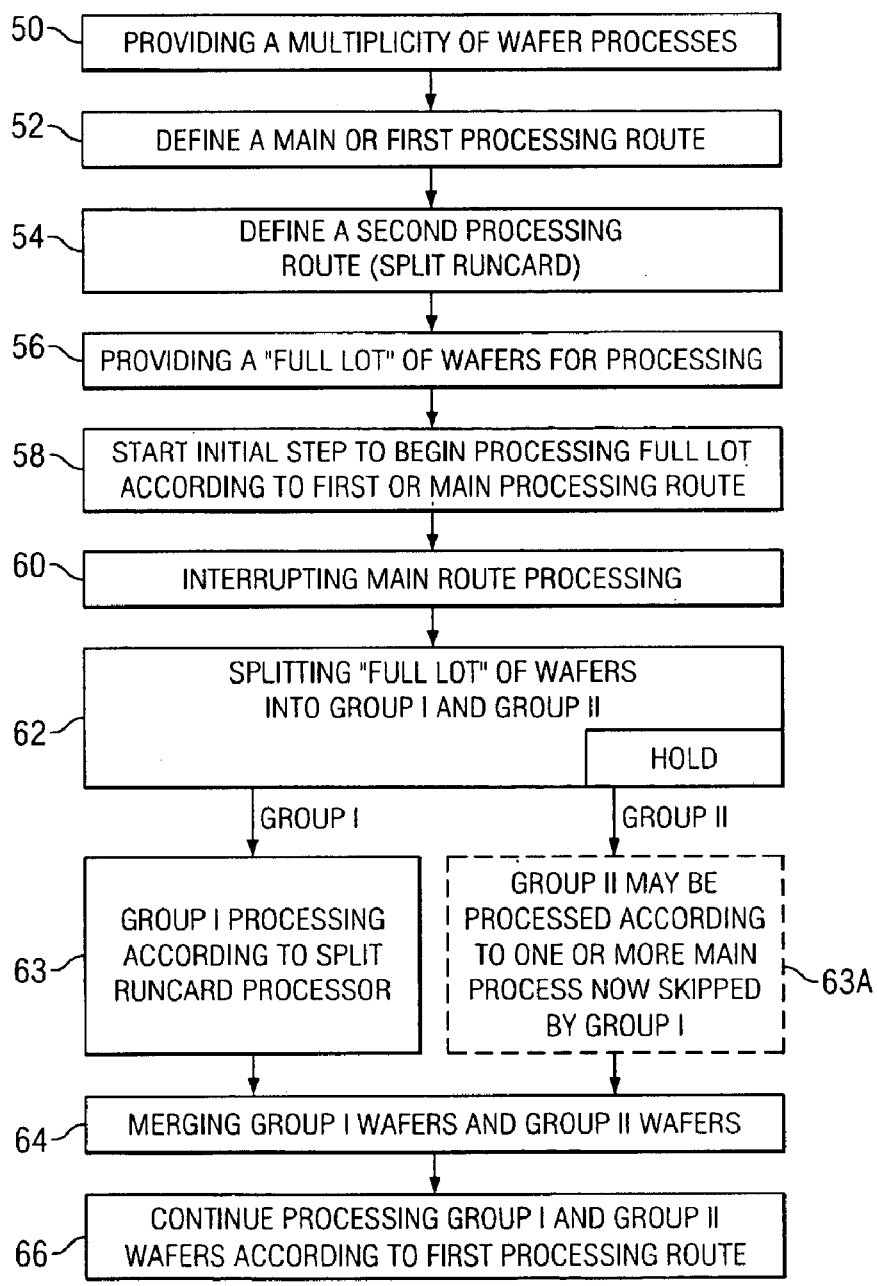

FIG. 3

| 40 | CONDITION 1 | RECIPE A | WAFER ID'S 1,3,5,7,9 |
| 42 | CONDITION 2 | RECIPE B | WAFER ID'S 2,4,6,8,10 |
| 44 | CONDITION 3 | RECIPE C | WAFER ID'S 2,4,6,8,10 |
| 46 | CONDITION 4 | RECIPE D | WAFER ID'S 1,2,3,4,5,6,7,8,9,10 |

FIG. 4

- 50: PROVIDING A MULTIPLICITY OF WAFER PROCESSES
- 52: DEFINE A MAIN OR FIRST PROCESSING ROUTE
- 54: DEFINE A SECOND PROCESSING ROUTE (SPLIT RUNCARD)
- 56: PROVIDING A "FULL LOT" OF WAFERS FOR PROCESSING
- 58: START INITIAL STEP TO BEGIN PROCESSING FULL LOT ACCORDING TO FIRST OR MAIN PROCESSING ROUTE
- 60: INTERRUPTING MAIN ROUTE PROCESSING
- 62: SPLITTING "FULL LOT" OF WAFERS INTO GROUP I AND GROUP II | HOLD
- 63: GROUP I PROCESSING ACCORDING TO SPLIT RUNCARD PROCESSOR
- 63A: GROUP II MAY BE PROCESSED ACCORDING TO ONE OR MORE MAIN PROCESS NOW SKIPPED BY GROUP I
- 64: MERGING GROUP I WAFERS AND GROUP II WAFERS
- 66: CONTINUE PROCESSING GROUP I AND GROUP II WAFERS ACCORDING TO FIRST PROCESSING ROUTE

DYNAMIC CONTAMINATION CONTROL OF EQUIPMENT CONTROLLED BY A SPLIT RUNCARD

This application claims the benefit of U.S. Provisional Application No. 60/432,480, filed on Dec. 11, 2002, entitled Dynamic Equipment Contamination Control For Split Runcard Management System, which application is hereby incorporated herein by reference.

TECHNICAL FIELD

The present invention relates generally to automated processing of semiconductor wafers using split runcards for selecting alternate processing steps, and more specifically to providing dynamic contamination control of processing equipment when using split runcards.

BACKGROUND

Modem semiconductor fabrication facilities (often referred to as FABs) typically use MES (manufacturing execution system) to control "Lot" flow equipment operations and proper conditions to achieve fully automated operations. One successful MES solution is the SiView standard system produced by IBM which supports the integration of an AMHS (Automated Material Handling System) and supports use of 300 mm FOUPs (Front Opening Unified Pods) while also maintaining support of a 200 mm carrier system.

A unified pod for processing wafers carefully maintains the purity of a small inside space of the unified pod. Because the purity of the small inside space of the pod is controlled, the purity of the clean room is less critical. Thus, the use of a unified pod saves wafer manufacturing equipment cleaning costs. However, external dust or human body dust may be carried into the manufacturing equipment when opening the cover of the typical unified pod, and thereby contaminate the wafers. A FOUP (Front Open Unified Pod) auto loading structure is suitable for use in the loading-in-interface in a wafer manufacturing process to automatically close/open the cover of a FOUP and thereby help avoid this type of contamination. The FOUP includes a machine base, a carriage, a sliding control mechanism, a clamping mechanism, a horizontal shifting mechanism and a lifting mechanism. The FOUP is put on the carriage and held down by the clamping mechanism. It is then moved in contact with a gate on an axis on a backboard of the machine base. A cover of the FOUP is then opened by a cover close/open control mechanism at the back of the gate. The cover is then carried backward away from the FOUP by the horizontal shifting mechanism and then lowered with the lifting mechanism. The cover is closed on the FOUP when reversing the procedure. The automatic FOUP cover closing/opening operation helps prevent wafer contamination.

The SiView standard system conforms to industry standards and allows for a high degree of changes and interoperability, R&D experiments, STR (special test report) requests, tuning of equipment recipes, etc. Changes in the type, order or parameters of the automated processes for such experiments and STR requests are typically initiated by a "list of new processes," changes in the order of processing, or process parameters which are changed to or in addition to an existing or defined automatic process. This list is often referred to as a "Runcard," or more specifically as a "Split" Runcard. However, such changes as specified by a "Split" Runcard cannot be automatically handled or tracked by the system. Consequently, until the present invention it was necessary that FAB operators manually assign the equipment ID required by a recipe and use a manual mode to process a "Lot" of wafers according to a Split Runcard that deviated from the pre-defined semiconductor processes carried out automatically by an IBM SiView standard system.

A typical SiView standard system used to manufacture semiconductors requires that the contamination level of the "Lot" of wafers, the equipment used to process the Lot and the FOUP be designated or flagged. Further, unless all three of the wafer Lots, the processing equipment and the FOUP are all at the same contamination level and carry the correct flag or indica, the wafer Lot and process equipment cannot be loaded or "tracked" into the FOUP for processing.

As will be appreciated by those skilled in the art, according to the prior art a manufacturing or process run on a "Lot" of wafers always followed a predefined series of processes and used the same items of process equipment. Consequently, once the contamination status was correctly mapped through the process equipment and the process was proven successful and "signed off" a simple contamination check or comparison check of the equipment, wafer Lot and FOUP was sufficient to prevent the occasional contamination mismatch error. As will also be appreciated and as discussed above, the use of a Split Runcard to change recipes, process equipment or the order of processing was accomplished by manual intervention by the FAB operator. Therefore, if the equipment required by a Split Runcard was not the same as the equipment required by the predefined sequence of processes, the MM server would simply reject the "operation start" request and the FAB operator would evaluate the situation and make the necessary corrections or changes. Thus, contamination level compatibility between wafer Lot, processing equipment and FOUP was one of the many items managed manually by the FAB operator. Of course, a great deal of time could be lost in correcting the contamination level compatibility problem or expensive cleanup procedures could be required if the problem was not corrected prior to tracking in of equipment and wafers into a FOUP Therefore, if Split Runcard operations are to avoid contamination control problems it is also necessary that contamination monitoring and control of alternate or changed processes also be evaluated automatically before the start of an operation or process run and that contamination levels of the wafer Lot be dynamically changed when appropriate or different processing equipment and FOUP's be selected.

SUMMARY OF THE INVENTION

These and other problems are generally solved or circumvented, and technical advantages are generally achieved, by preferred embodiments of the present invention as discussed below.

A method for maintaining compatible contamination levels between wafers being processed and the processing equipment during an automated manufacturing run controlled by an MES (manufacturing execution system) and a Split Runcard is provided by this invention. The method comprises establishing a predefined or first sequence of steps which include a plurality of different processes for manufacturing semiconductors. A specific process which will be a reference process for a split condition is identified. A second sequence of steps which includes one or more processes as identified by a Split Runcard is also provided. Each item of equipment associated with the first sequence of steps and second sequence of steps will carry indica indicating a contamination level. The processing of a full "Lot"

of wafers according to the first sequence of steps is then started, and the contamination level of the full Lot of wafers is continually evaluated and determined during this processing.

Processing of the full Lot of wafers is then interrupted prior to execution of the specific or identified process in the first sequence of steps. The full Lot of wafers are then divided into a first group of wafers and a second group of wafers and both the first group and second group now have the same contamination level designation. The first group of wafers is then further processed according to the second sequence of steps and the contamination level of the first group of wafers will be set to a contamination level as determined by the executed process of the second sequence of steps. Upon completing processing according to the second sequence of steps, the first group of wafers is combined or merged with the second group of wafers, and the contamination level of both combined groups is set to the highest contamination level of the two groups. It will be appreciated of course that prior to the first and second group of wafers merging the second group of wafers may be further processed according to one or more processes included in the first sequence of steps. It should also be appreciated that after the two groups of wafers have been merged or combined, processing of the combined group may continue according to the first sequence of steps or processes.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other processes for carrying out the same purposes of the present invention. It should also be realized by those skilled in the art that such equivalent processes or methods do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 illustrates a method for determining the order of wafer processing for a "Lot" of wafers being processed according to a Split Runcard or split condition;

FIG. 4 is a flow chart illustrating the process flow of the present invention;

DETAILED DESCRIPTION OF ILLUSTRATIVE EMBODIMENTS

Figure 1:
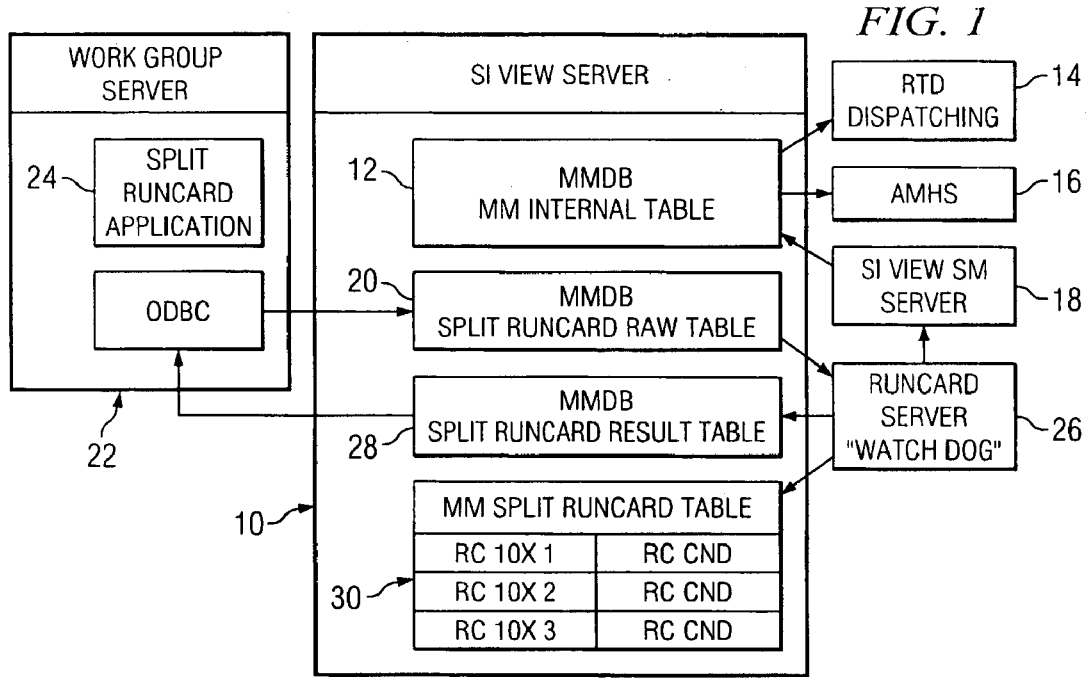
FIG. 1 is a block diagram of a portion of a SiView system (such as IBM) which also incorporates the features of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to practice the invention, and do not limit the scope of the invention.

The present invention will be described with respect to preferred embodiments in a specific context. As will be appreciated by those skilled in the art, a modern wafer processing plant is comprised of equipment for carrying out a large number of different processes on a wafer or "Lot" of wafers such as for example one or more 300 mm silicon wafers. In addition to including equipment for many various and different processes, it will also be appreciated that it is not unusual for many of the processes (such as for example, masking, etching and depositions) to be required several times during the manufacture of different semiconductor devices. Examples only of a few of the necessary wafer processes include various deposition processes including CVD, Sputtering and Spin-Coating. Likewise, photoresist coating, lithography with many different reticles or masks, converting of the photoresist to a mask and etching are all well-known processes. Further, depending on processes subsequently required by a wafer, it may also be necessary that a process be carried out in a very low contamination environment for some purposes whereas higher contamination levels may be perfectly acceptable for carrying out the same process for other purposes. Consequently, the processing plant may include two items of processing equipment that are exactly the same and carry out exactly the same processes except at two different contamination level designations. The particular material recipe of the deposited material, or etching materials and other parameters, may also vary significantly from one operation to another.

Thus, it is seen that a huge amount of data covering the various processes, materials, pressures, temperatures, contamination levels, etc., must be carefully tracked and recorded for any specific automatic manufacturing run. To this end, a predefined order of processing steps for processing a wafer, the material recipes for the various processes, the required equipment and a record of these different parameters is typically developed for a manufacturing run of a semiconductor device. For each manufacturing or production run, this information is listed and controlled by a "Runcard." A "Runcard" will also include specific ID's of the wafers used in the process along with other specific information related to each piece of processing equipment (such as equipment ID's and designated contamination levels) and the materials used such as the manufacturer, date of manufacturing, etc. Consequently, a Runcard is used only once even though the manufacturing process for manufacturing particular semiconductor devices may be used repeatedly. The predefined sequence of actions used to control the equipment ID's and materials required for a particular effective and efficient process may be used for an extended period of time to manufacture thousands and thousands, or even millions of units of a particular semiconductor device. However, as discussed above, since the wafers are different and the other materials are consumable and may be provided by more than one supplier, a new Runcard will be required for each manufacturing run.

In an attempt to continually improve yields and performance of a successful manufacturing process, fine tuning of the materials and process is not uncommon. However, it is very important that a proven successful sequence of steps, material recipes, etc., not be changed until the process engineer is quite certain that the fine-tuning of the process will yield the desired results. Therefore, if a new experiment or research concerning an altered process or material or request is to be tested, for purposes of control and comparison, it is advantageous to process a "Lot" of wafers in two groups. The first or experimental group will, for example, preferably be processed exactly according to the proven processes and successful sequences of actions except for the specific change that is being tested and evaluated. The second or control group of the "Lot" will be processed along with the experimental group except it will follow the original proven process without exception. Thus, all of the differences and results (good or bad) between the first and second groups will be solely due to the experimental change in the process or recipes.

Prior to the present invention, all experimental process changes to the first group of the wafer Lot were handled by the FAB operator manually assigning recipes, ID's of the equipment and using a manual mode rather than an automated mode to process the wafer Lot according to two different processes. Unfortunately, it is estimated that using a manual mode to process a wafer Lot according to a Split Runcard typically results in a 20% increase in MO's (missed operations). An MO is defined as a FAB operator's mistake that results in the wafer being scraped. Typically mistakes include selecting the wrong equipment and/or material recipes as well as subjecting the wafer Lot to the same process twice (i.e., double processing), etc.

Manual handling of experimental test runs carried out concurrently with a predefined normal manufactured run has also been necessary when using automatic systems. As an example, an MES (manufacturing execution system) using the IBM SiView system to automatically control Lot flow, equipment operations and process conditions for typical manufacturing runs, must still depend on significant FAB operator involvement and manual control of many operational activities. Although a second or "Split" Runcard can be used with the IBM SiView system, to change the process flow or equipment ID's or recipes, the process change will not be fully automatic since the MES will not have all of the necessary information to compensate for the contents of the data related to conditions and instructions for processing. That is, wafer processing controlled by the "Split" Runcard is tracked as a "dynamic branch request" and will follow one or more different processes for specific purposes such as masks, recipes, measurement specifications, etc. Consequently, the process flow and the missing data and information is provided or controlled manually by the FAB operator. Further, after the processes controlled by the "Split" Runcard have been completed, a "Skip" operation is often necessary since the "Split" Runcard may have replaced one or more of the original processing steps. Therefore, if the replaced operation or processes are not skipped the "Split" Runcard wafers will be subjected to double processing and will almost certainly be scrapped. Thus, it is not uncommon that a "dynamic branch request" causes or results in a large number of problems for the process flow and ends with a large number of processed wafers being scrapped. A major cause of the increased number of problems is that the "Split" Runcard as used by the prior art processes only includes basic equipment data and does not contain or relay all of the necessary definitions and attributes of the temporary processes much less the contamination designations of the equipment. The present invention provides a fully automated technique for using a "Split" Runcard which modifies and enhances the MES at the beginning of a process run so that the necessary information is available for all of the Split Runcard processes, including the correct contamination level designations or flags.

Referring now to FIG. 1, there is a block diagram of a portion of an IBM SiView system incorporating the present invention. As shown, there is a SiView server 10 (available from IBM) including a memory area for an MM (material manager) internal table or DB (database) 12. MMDB 12 exchanges information with the RTD (real time dispatching) 14 and the AMHS (automated material handling system) 16 as received from the SM (specification manager) 18. Another memory area 20 stores Runcard raw table data as received from a first or Split Runcard of this invention to be discussed later. As an example, the process engineer requesting the experimental test run can provide information and data concerning the necessary changes to the FAB operator by means of a message or note on the workgroup server 22 that the process will include a Split Runcard application 24. Likewise, for administrative and management purposes the Split Runcard may include the name of the process engineer, a Runcard ID number, or perhaps even the telephone number of the process engineer in case of need for immediate support. Thus, a Runcard server (workgroup) 26 can be used to act as a control center for informing the FAB operator that the run will include an experimental or test component (i.e., the "Split" Runcard) as well as for releasing processing data to the SM (specification manager) 18 through the ODBC (Open Database Connectivity). Consequently, the Runcard process data will have the same format as the normal process data provided by a split SiView system, since all of the correct attribute data is included. In addition, the Split Runcard will include the necessary information required by the MES (manufacturing execution system) to assure that the wafer run will include two different processing routes (i.e., one for the normal processing and one for the experimental processing) and will evaluate the contamination level designations of the items of required equipment to assure that there will not be a contamination mismatch between the wafer, the equipment or the FOUP during the split condition processing or during its normal processing subsequent to the rejoining or merging of the Split Wafer Lot and the production run wafer Lot. The MM (material manager) server 10 also includes a storage area or table 28 for the Split Runcard results that allow the Runcard watchdog or server 26 to write back to the workgroup server 22 information concerning measurement data. Thus, the Split Runcard raw table 20 and the Split Runcard result table 28 of the MM server 10 can be used as the data exchange interface between the IBM SiView system 10 and the workgroup server 22. The Runcard watchdog 26 also reorganizes and stores the raw Split Runcard information or information received from the workgroup in the MM Runcard table 30 indexed according to the corresponding Runcard. Thus, the data resulting from the conditions set up by the Split Runcard is stored in the appropriate indexed locations.

Thus, the system according to this invention provides benefits such as independent operation of the workgroup server or workstation 22 and the MES which allows the workgroup server 22 to continue operating when the MES is down for maintenance and also allows the MES to continue operating when the workgroup server is down for maintenance. The system of this invention remains fully compatible with the AMHS 16 and RTD 14 which allows the AMHS to automatically transfer wafer LotS and for the RTD to continue real-time dispatching a Split Runcard Lot with a normal or standard Lot.

As an example, the type and flow of proven data of this invention when based on an IBM SiView system is substantially is the same as in the unmodified IBM SiView system. Thus, data related to the Split Runcard Lot can be automatically tracked in and out of the system which allows for the full history record of equipment ID's, contamination levels, processing times, wafer quantities, user, recipes and other data to be saved for future analysis which gives the process engineer greater flexibility to record and tune an experiment as necessary. In addition, the rate of fully automatic processing can be increased from 70% to 80% while at the same time reducing the number of scrapped wafers (i.e., MO's). Other advantages include using the workgroup server 22 to support sign-off flow. Separating the MES from the sign-off flow allows the MES to remain focused on the resulting data including the Split Runcard data and keep the system simple. Furthermore, since the workgroup 22 and the MES are independent, it is not necessary to always use the same MES (manufacturing execution system). That is, a process engineer can use the workgroup server 22 to run a follow-up experiment by porting the new Split Runcard data to a different MES. If different ID rules or other parameters are used for the Split Runcard processing data, the variables in the MES can be identified so that other CIM (computer integrated manufacturing) systems can use the data to support or integrate the Runcard Lot data.

Figure 2:
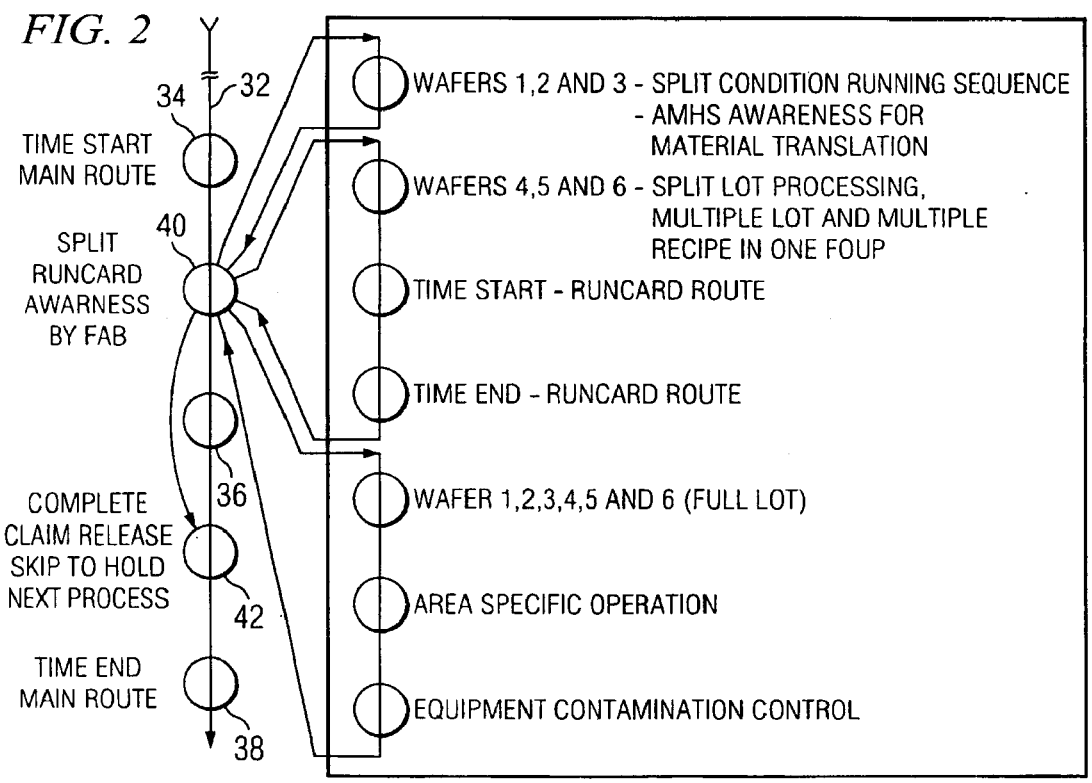
FIG. 2 is a diagrammatic representation of the life cycle of a "Split" Runcard according to the teachings of the present invention.

Referring now to FIG. 2 along with FIG. 1, there is illustrated a Split Runcard life cycle as it interfaces with a normal Runcard or predefined process route. As shown, a portion of a predefined main process route 32 that, as an example only, originally included "time-start" action or step 34, process step 36, and "time-end" step 38 has been changed to also include a "Runcard awareness" or interrupt step or action 40 which puts a portion of the wafer Lot which is to be processed according to the predefined route (i.e., the normal or non-Split Runcard Lot) on "hold" and switches the Split Runcard Lot to a different set of processing steps as will be discussed below. Also included is a "Split Runcard Lot complete" step 42 which also releases the "hold" for the non-Split Runcard Lot so that the non-Split Runcard Lot follows the original processing of the predefined process at step 36 while also skipping the Split Runcard Lot portion past process 36. Thus, when the non-Split Runcard Lot completes the processing step at 36, the two Lots (Split Runcard Lot and non-Split Runcard Lot) are rejoined or merged and the required processing time is noted at the "time-end" step 38.

Parameters that must be considered when generating a Split Runcard include as examples only:

Awareness of a Split Condition and Notice of Completion of Split Condition.

It is important to provide a process or method for the process engineer to provide notice or awareness of the Split Runcard to the FAB operator and of course the MES or manufacturing execution system such as indicated at step 40 in FIG. 2. It is also important that once the "Split Runcard" processes have been completed that the MES automatically executes any operations necessary to reposition the Split Runcard Lot to a proper status for subsequent processing. To help accomplish this, the normal or non-Split Runcard Lot processing along a main route will be put in a "hold" status (also as indicated at step 40) just prior to beginning the required processes of the "Split Runcard" processing. As mentioned above, a message advising of the "Split Runcard" may be provided as a "Lot Note" from the process engineer by the workgroup server 22 to the MES. To avoid confusion as to what alternate processing or Split Runcard should be carried out first, a preferred practice is to issue only one "Split Runcard" for a Lot with respect to a specific operation. Once the "Split Runcard" operation has been completed, a "completion claim" or flag is set or triggered to cause the system to automatically skip the main route function or process 36 that is being replaced by the Split Runcard processes.

Split Runcard Execution Sequence.

Since the sequence of the various operations or treatments of a wafer is usually critical, and since assuring the proper sequence for both groups of a Split Wafer Lot can be problematic, a good procedure is to execute operations or steps from the smaller number of operations to a large number of operations. For example, referring to FIG. 3 it is assumed that a wafer Lot has wafers with ID numbers 1–10 and the wafer Lot is subdivided or separated into a first group of wafers with ID numbers 1, 3, 5, 7 and 9 and a second group of wafers with ID numbers 2, 4, 6, 8 and 10. Thus, even though the condition 1 indicated at reference numeral 40 which processes wafers 1, 3, 5, 7 and 9 is listed first, condition 2 comprising wafers 2, 4, 6, 8 and 10 indicated at reference numeral 42 should be executed first followed by condition 3 as indicated at 44, which also processes wafers 2, 4, 6, 8 and 10. Condition 1 as indicated at 40, which processes wafers with ID's 1, 3, 5, 7 and 9 is then executed. Finally, condition 4 which processes all of the wafers 1–10 can only be executed after conditions 1–3 have been completed since the operation is used to treat or process all the wafers in the Lot.

Q-Time Management.

Since a "Split Runcard" means at least one Lot group must be in a "hold" or "wait" condition while the other Lot group is being processed, the Q-time must be managed to not only allow proper analysis, but also to assure the skip operations occur at the right time or sequence so that the recombined Lot groups are correctly positioned for the next processing step.

Compatibility with Multiple "Lots".

For analysis evaluation of test results, it is desirable that a "Split Runcard Lot" be "batched" or run with a normal process or production Lot (i.e., a non-Split Runcard Lot) and when 300 mm FOUP equipment is used, it is possible to process a Split Runcard Lot and a production Lot in the same FOUP if the attributes, such as the route, stage, operation, equipment ID and equipment track recipe of the Split Runcard Lot and the production run Lot are the same. However, since a "production Lot" will be put on "hold" while the Split Runcard Lot is being processed by the alternate sequence of processes, and then the Split Runcard Lot may be required to "wait" while the production Lot is being processed by the original sequence of processes, it is necessary that the equipment controller for the FOUP immediately recognize that the production Lot is on "hold" and the Split Runcard Lot is "waiting" and continue processing along the predefined route. Otherwise, the processing of the combined Lots will simply stop.

AMHS Awareness for Material Transporting.

Since the target for 300 mm operations is complete automation, and since the MES will now be upgraded so that it can generate and manage a Split Runcard Lot, the AMHS and dispatching system should also be upgraded to recognize and include the requirements of the Split Runcard Lot while generating the dispatching list.

Determining Contamination Levels.

Finally, the contamination level designation or flag of a Split Runcard Lot cannot simply assume the contamination level or flag used by the main route production Lot since doing so could contaminate equipment used for later processing or operations. The Split Runcard Lot contamination level must be compatible with the equipment it requires which may well be different than the equipment used by the production Lot. Consequently, it ns necessary that the MES should include a method for determining the most appropriate level for the Split Runcard Lot contamination flag or level.

Referring now to FIG. 4, there is a block diagram illustrating Split Runcard processing steps according to one embodiment of the present invention. As shown at step 50, a multiplicity of wafer processes used in the manufacturing of semiconductor devices are provided. A main processing route or sequence of actions or steps including a starting point or initial action and which includes treating or processing a "Lot" or group of wafer with selected ones of a multiplicity of wafer processes in a selected order is defined or set up as indicated at step 52.

A second sequence of actions or steps which includes at least one of the provided multiplicity of wafer processes is defined or set up by a Split Runcard as indicated at step 54, and a multiplicity of wafers or a full "Lot" is provided for processing as indicated at step 56. The full Lot of wafers is suitable or adapted for being subdivided or separated into a first Lot such as an experimental or "Split Runcard" Lot and a second Lot such as a normal production Lot. Processing of the multiplicity or full Lot of wafers is then started at the initial action and follows the first sequence of events or actions as indicated at step 58. At some point along this main route or sequence of actions, the sequence of steps is interrupted before beginning the next processing event as indicated at step 60. Then, as shown at step 62, the full Lot or multiplicity of wafers is subdivided into a first group and a second group and processing of the first group continues according to the "Split Runcard" or second sequence of actions as shown in block 63 while the second group is put into a "hold" condition. After the first group of wafers has completed the steps outlined on the Split Runcard, the second group of wafers may or may not be processed by an original processing step as indicated by block 63A in dotted lines. The two groups of wafers are then rejoined or recombined into the full Lot again as indicated at step 64 and processing of the full Lot continues according to the first sequence of events or the main route as indicated at step 66. As has been mentioned, the processing of group 1 as required by the Split Runcard can comprise one or more processing events which replace a selected identifiable process in the main route or first sequence of actions. In this situation, the Split Runcard sequence of actions will include a command for the group 1 wafers to skip the identified process being replaced and will then "wait" for the wafers of group 2 to complete the identified process before rejoining group 1. Alternately, the processing of group 2 is on hold during the processing of group 1 as required by the Split Runcard or second sequence of actions. Then the groups are rejoined and processing of both groups continues according to the first sequence of events. That is, group 2 experiences all the processing that group 1 experiences as well as any additional processing required by the Split Runcard or second sequence of actions.

Figure 5:
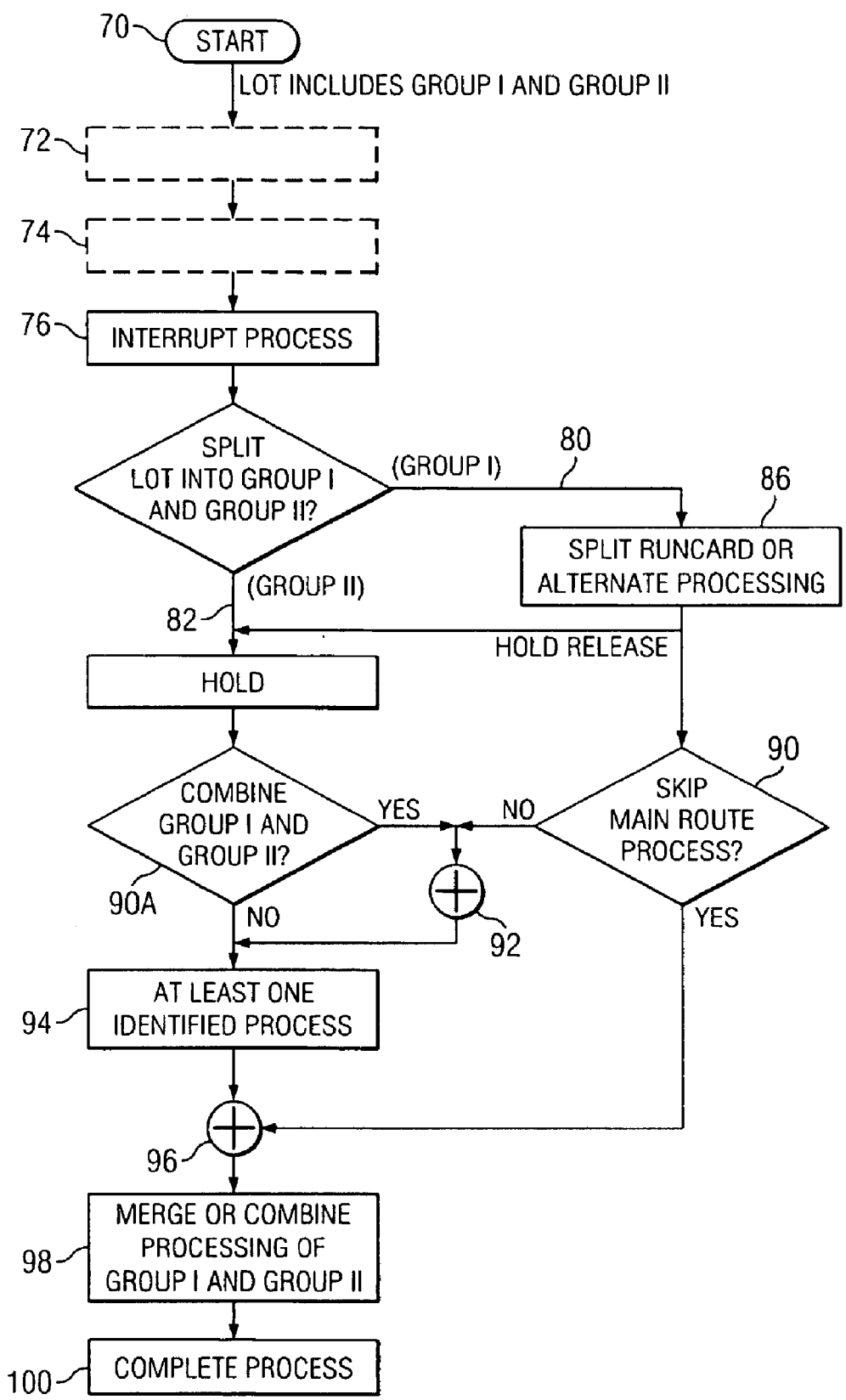
FIG. 5 is a logic diagram illustrating the process of FIG. 4.

Referring to FIG. 5, there is an example of a logic diagram describing the Split Runcard process. It should be noted that the logic diagram of FIG. 5 is provided only to aid in understanding the interaction and operations of a Split Runcard wafer Lot and a main route or production wafer Lot according to the invention. The actual logic processes carried out by an MES system controlled by the IBM SiView standard system may or may not be similar to the logic given as an example in FIG. 5. As shown at starting point 70, a "full Lot" of wafers includes a first group and a second group. This full Lot of wafers may then be subjected to a series of predefined processing steps as indicated at step 72 and 74 in dashed lines prior to encountering an interruption step 76. However, it is possible that the process flow may be interrupted at step 76 before any of the wafers have been subjected to a processing step. That is, there will be no steps 72 and 74 for processing of the wafer Lots. After the predefined process flow is interrupted as indicated at step 76, the alternate process flow proceeds to logic block 78 where the full Lot of wafers is divided into group 1 which follows the Split Runcard process path 80 and group 2 which will follow the original predefined processing steps along path 82. As shown, processing of the non-Split Runcard wafers along path 82 is immediately put on "hold" as shown at step 84. This "hold" condition is maintained until all of the alternate steps as indicated at step 86 are completed at which time a hold release signal on line 88 is provided to hold step 84. At the same time, the alternate path 80 encounters logic block 90 to determine if the wafers in group 1 should bypass or skip one or more processes in the predefined processing or main route. After experiencing the alternate or Split Runcard processing, if the original or predefined processing is required, the first or Split Lot is forwarded to step 92. In a similar manner, group 2 wafers encounter logic block 98 which determines whether group 2 and group 1 should be recombined or merged at this point. It not, the wafers in group 2 continue along the main route and are further processed at step 94. However, if group 1 wafers and group 2 wafers should be recombined or merged, then group 2 is also forwarded to step 92 where groups 1 and 2 are rejoined as a full "Lot" before the processing continues at step 94. However, if group 1 does not require processing by step 94, group 1 of the wafer Lot is moved to step 96 where it "waits" until group 2 completes the required processing at step 94. After processing of group 2 at step 94 is completed, group 2 continues to step 96 where it is then recombined or merged with group 1 and processing of group 1 and group 2 wafer Lots continues according to the first sequence of events of the main route as indicated at step 98 until the processing is completed as indicated at step 100.

As was discussed above, prior to the present invention contamination control was a simple matter of comparing the contamination level or status of the wafer Lot, the processing equipment being used and the FUOP. The contamination levels of all three of these items had to be the same or the operation start sequence would be rejected. Consequently, since most "Split Runcard" operations will require different equipment, if Split Runcard processing is to be fully automated, there must also be a method for automatically or dynamically evaluating and setting contamination levels prior to starting a process as well as revising or changing the contamination level or status of a wafer Lot and/or the FOUP when appropriate.

Figure 6A:
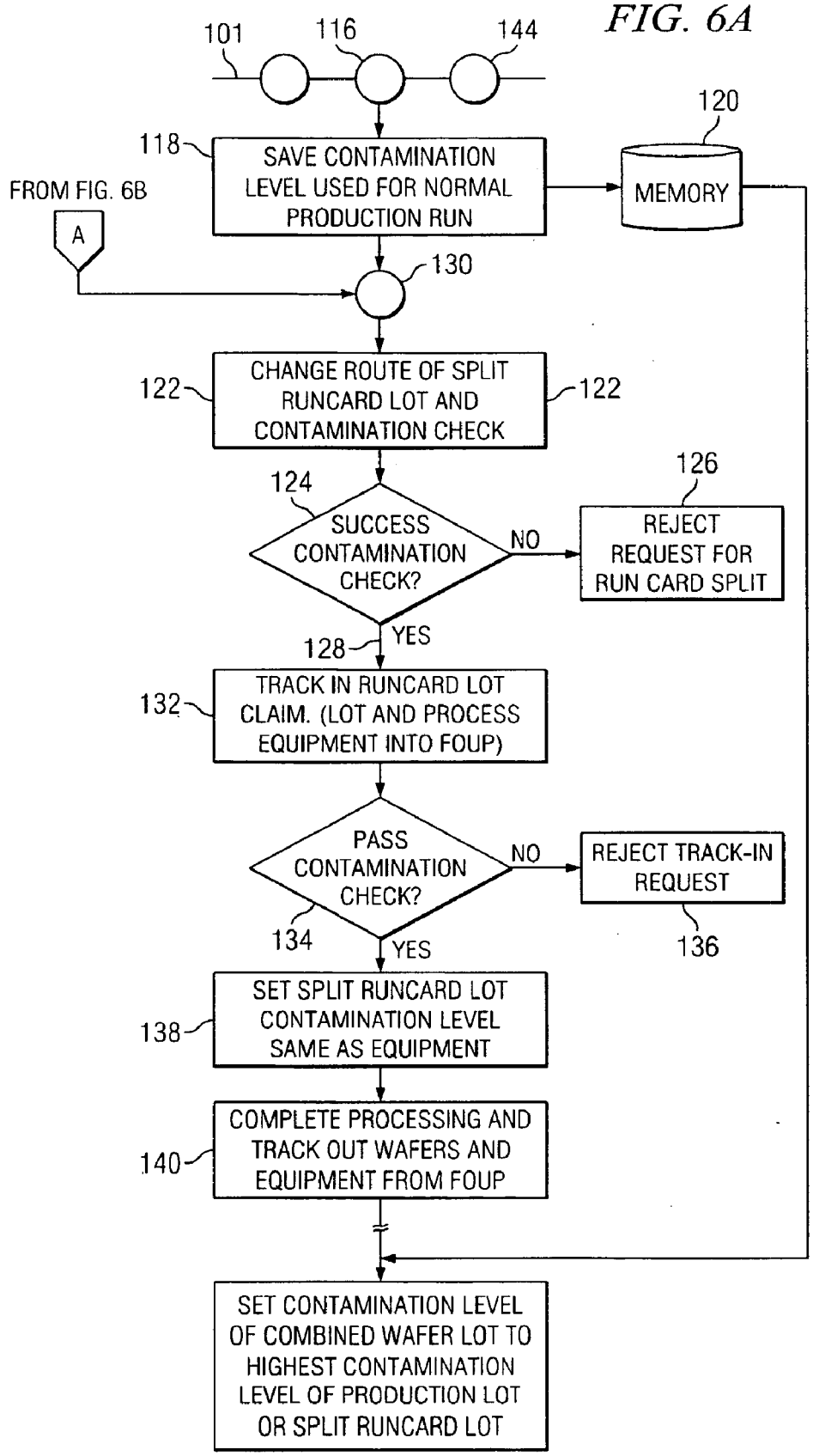
FIG. 6 illustrates the process flow and logic control for providing contamination control of processing equipment used for a Split Runcard manufacturing run.
Figure 6B:
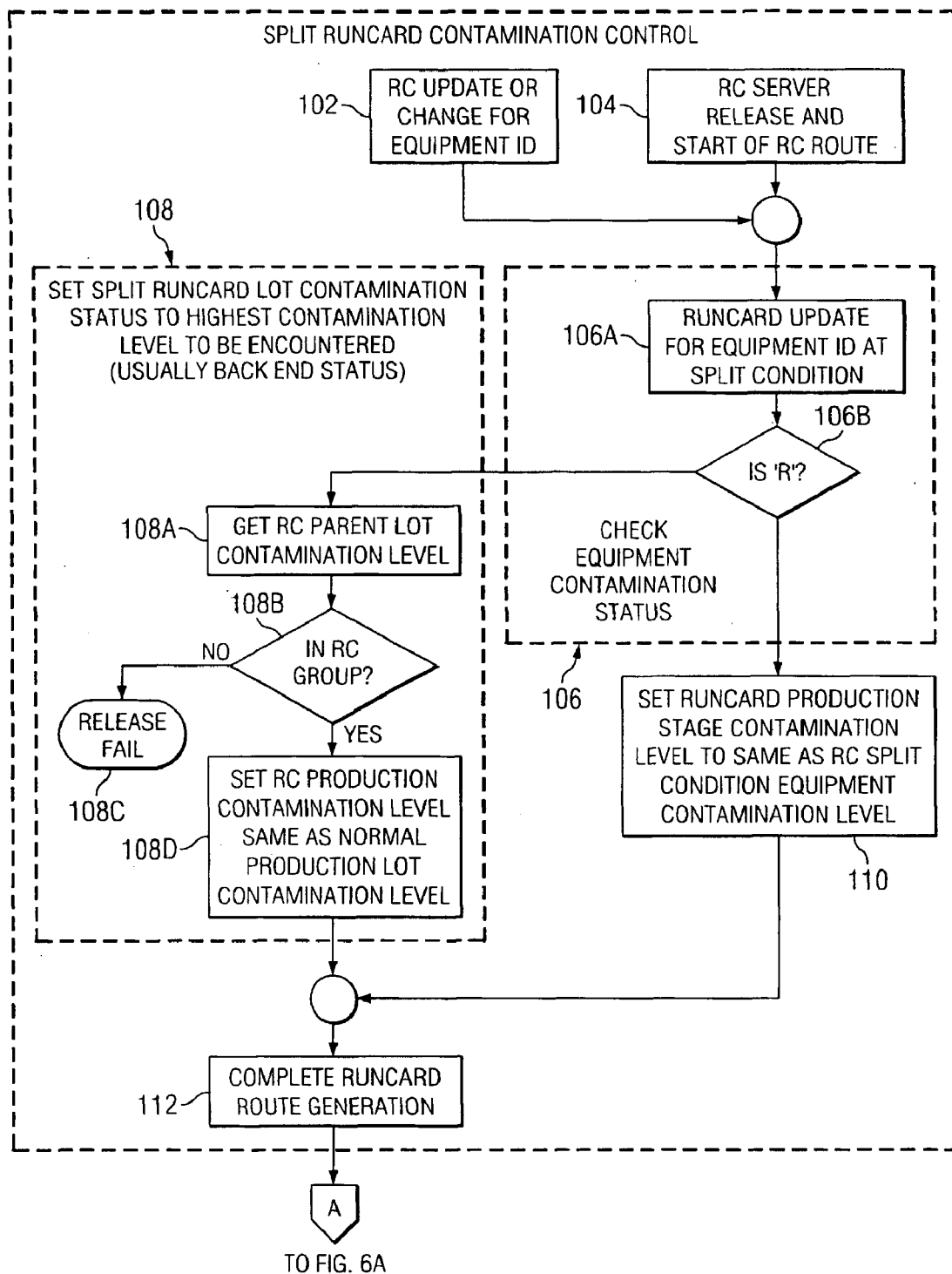

Therefore, referring now to FIG. 6, there is shown a logic diagram for providing dynamic contamination control for equipment required by a Split Runcard. As shown, prior to a typical process run along a predefined process path or main route 101, the process engineer has made the FAB operator aware of the "Split Runcard" that will be encountered during the process run and that will change the equipment ID at the split condition as indicated at logic block 102. Thus, the "Runcard" server, as discussed above, starts the process to provide "Split Runcard" routing to the SM server as shown at block 104. The contamination status of the equipment to be used during the "Split Runcard" portion of the process run is then checked as indicated at logic block 106, for compatibility with the equipment used during the main route for a normal production run. If the "back end" of the process run is to be shared by both the production lot of wafers and the Split Runcard Lot (i.e., the same process) the Runcard Lot contamination level or status is set to the highest contamination level encountered during the Runcard processing as indicated at logic block 108. The "back end" typically carries the highest contamination level. Also, if the "front end," the copper processing or the sorter is the same for both the production Lot and the Runcard Lot with or without sharing the "back end" processing, then the wafer Lots are to be set to the same weighing or contamination levels as the equipment required by the various process as indicated at 110. After the contamination levels have been set as determined at logic blocks 108 and 110, the SM completes generation of the Runcard route as indicated at block 112. The Runcard route details or information generated by the SM is then provided to the system on line 114.

When the full Lot of wafers comprised of both the main route production run wafers and the "Split Runcard" run wafer reaches the split condition step 116 of main route 101, the contamination level of the FOUP used for the manual production run is saved in memory as indicated at step 118. The Runcard Lot of wafers is then redirected to follow the Split Runcard route as shown at step 122. Prior to starting the Split Runcard route of processing the contamination level of the FOUP, the Runcard wafer Lot and the equipment is checked for compatibility as indicated at logic block 124. If the contamination compatibility check is not successful, the MES will reject the Runcard Split request as indicated at block 126 and processing of the Split Runcard Lot will not continue. However, if the correct contamination level settings have been made and the contamination level check is successful, this information on line 128 is combined with the Split Runcard route information on line 114 as indicated at 130 which starts processing or tracking in of the Split Runcard Lot of wafers and equipment into the FOUP as indicated at block 132. In the same manner that contamination levels are compared for the full wafer Lot, the processing equipment and the FOUP for a manual production run to prevent equipment contamination, the contamination levels are also compared for a "Split Runcard" Lot as indicated at 134. If for some reason there is an incompatibility, the request to track in the equipment and the Split Runcard Lot of wafers is rejected as indicated at step 136 and the processing is halted. However, if the contamination level compatibility check passes, the "Split Runcard" Lot of wafers is tracked into the FOUP and the contamination level is set or lowered to be the same as the contamination level of the equipment (if not already at the same level) as indicated at block 138.

After the process is complete, the second Runcard wafer Lot is removed or tracked out of the FOUP as indicated at block 140. At this point, the contamination level of the FOUP (and Split Runcard Lot of wafers) is compared to the contamination level or status of the production Lot of wafers saved at memory 120 and either the saved status of the production Lot is restored or the contamination level or status of the production Lot is reset to the contamination level of the FOUP, whichever has the highest level of contamination as indicated at block 142. It will be appreciated that both the production Lot of wafers and the Split Runcard Lot will both again now be at the same contamination level or status so that processing along the predefined or main route 100 of the Lots can proceed to the next processing step 144.

Although the present invention and its advantages have been described in detail, it be understood that various changes, substitutions and alterations can be made herein without departing from the spirit and scope of the invention as defined by the appended claims.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for maintaining compatible contamination levels between wafers being processed and the processing equipment during an automated manufacturing run controlled by an MES (manufacturing execution system) and a Split Runcard comprising the steps of:

establishing a predefined or first sequence of steps, said first sequence of steps comprising a plurality of processes for processing wafers and including a first identified process;

providing a second sequence of steps comprising at least one process, each of said at least one process of said second sequence of steps having a contamination level;

processing a "lot" of wafers according to a selected process comprising said first sequence of steps, and determining the contamination level of said lot subsequent to completing said selected processes;

interrupting processing of said "Lot" of wafers prior to running said first identified process and dividing said "Lot" into a first group of wafers and a second group of wafers, each of said first and second group of wafers having said determined contamination;

processing said first group of wafers according to said at least one process of said second sequence of steps and setting the contamination level of said first group to the same contamination level as determined by said at least one process of said second sequence of steps;

merging said first group and said second group of wafers; and setting the contamination level of both of said merged first and second group of wafers to the contamination level of one of said first group and said second group of wafers, whichever is highest.

2. The method of claim 1 wherein prior to said merging step, said second group of wafers is further processed by at least one more process according to said first sequence of processing steps.

3. The method of claim 1 wherein both of said merged first and second groups of wafers are further processed together according to said first sequence of processing steps.

4. The method of claim 2 wherein both of said merged first and second groups of wafers are further processed together according to uncompleted steps of said first sequence of processing steps.

5. The method of claim 1 wherein after said interrupting step said second group of wafers is in a "hold" status without further processing until said merging step of said first and said second groups of wafers.

6. The method of claim 5 wherein said merged first and second groups of wafers are further processed together according to uncompleted steps of said first sequence of processing steps.

7. The method of claim 2 wherein said second group of wafers has a higher contamination level after said at least one more processing step such that said contamination level of said second group is higher than said first group prior to said merging step.

8. The method of claim 1 wherein said first group and second group of wafers have the same contamination level prior to said merging step.

9. The method of claim 1 wherein said first group of wafers has a higher contamination level than said second group of wafers prior to said merging step.

10. The method of claim 1 wherein said second sequence of steps is defined by a "Split Runcard."

11. The method of claim 1 wherein said plurality of processes are run on different items of provided processing equipment.

12. The method of claim 1 wherein said automated manufacturing run is for manufacturing semiconductor devices.

13. The method of claim 1 wherein after said interrupting step and prior to said step of processing said first group of wafers, said method comprises the step of determining that the contamination level of said first group of wafers is compatible with the contamination level of the at least one process comprising said second sequence of steps.

14. The method of claim 1 further comprising two separate items of similar equipment for running a selected semiconductor process wherein said two separate items carry a different contamination level.

15. The method of claim 10 further comprising two separate items of similar equipment for running a selected semiconductor process wherein said two separate items carry a different contamination level.

16. The method of claim 15 wherein said Split Runcard defining said second sequence of steps is generated by said MES and wherein the contamination level of said second group of wafers prior to said merging step is evaluated to determine what items of processing equipment are to be used in processing said first group of wafers according to said second sequence of steps.

* * * * *